US007315789B2

(12) United States Patent
Plett

(10) Patent No.: US 7,315,789 B2
(45) Date of Patent: Jan. 1, 2008

(54) METHOD AND SYSTEM FOR BATTERY PARAMETER ESTIMATION

(75) Inventor: Gregory L. Plett, Colorado Springs, CO (US)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 10/996,887

(22) Filed: Nov. 23, 2004

(65) Prior Publication Data
US 2006/0111854 A1    May 25, 2006

(51) Int. Cl.
*H02J 7/00* (2006.01)
(52) U.S. Cl. .......................... 702/63; 702/64; 702/65; 702/57; 320/132; 320/136
(58) Field of Classification Search ............ 702/63–65, 702/57, 58, 60, 130, 136, 179, 181, 187, 702/190, 185, 182, 183; 320/132, 127, 149–150, 320/134, 136, 101
See application file for complete search history.

(56) References Cited

U.S. PATENT DOCUMENTS

| 4,390,841 | A | * | 6/1983 | Martin et al. ................ 324/427 |
| 5,652,502 | A | * | 7/1997 | van Phuoc et al. ............ 702/63 |
| 6,534,954 | B1 | | 3/2003 | Plett ............................ 320/132 |
| 6,832,171 | B2 | * | 12/2004 | Barsoukov et al. ............ 702/65 |
| 6,892,148 | B2 | * | 5/2005 | Barsoukov et al. ............ 702/63 |

OTHER PUBLICATIONS

Gregory L. Plett; LiPB Dynamic Cell Models for Kalman-Filter SOC Estimation; The 19th International Battery, Hybrid and Fuel Electric Vehicle Symposium and Exhibition; Oct. 19-23, 2002; Busan, Korea; pp. 1-12.

Gregory L. Plett; Kalman-Filter SOC Estimation for LiPB HEV Cells; The 19th International Battery, Hybrid and Fuel Electric Vehicle Symposium and Exhibition; Oct. 19-23, 2002; Busan, Korea; pp. 1-12.

Gregory L. Plett; Advances in EKF SOC Estimation for LiPB HEV Battery Packs; Powering Sustainable Transportation EVS 20; Nov. 15-19, 2003; Long Beach, California; pp. 1-12.

Gregory L. Plett; Extended Kalman Filtering for Battery Management Systems of LiPB-based HEV Battery Packs Part 1 Background; Journal of Power Sources 134; 2004; pp. 252-261, no month.

Gregory L. Plett; Extended Kalman Filtering for Battery Management Systems of LiPB-based HEV Battery Packs Part 2 Modeling and Identification; Journal of Power Sources 134; 2004; pp. 262-276, no month.

Gregory L. Plett; Extended Kalman Filtering for Battery Management Systems of LiPB-based HEV Battery Packs Part 3 State and Parameter Estimation; Journal of Power Sources 134; 2004; pp. 277-283, no month.

Stephen W. Moore and Peter J. Schneider; A Review of Cell Equalization Methods for Lithium Ion and Lithium Polymer Battery Systems; 2001 Society of Automotive Engineers; Jan. 2001; pp. 1-5.

Eric A. Wan and Alex T. Nelson; Dual Extended Kalman Filter Methods; Kalman Filtering and Neural Networks; 2001; pp. 123-173.

Greg Welch and Gary Bishop; An Introduction to the Kalman Filter; SIGGRAPH 2001 Course 8; Los Angeles, California; Aug. 12-17, 2001; http: //info.acm.org/pubs/toc/CRnotice.html; pp. 1-80.

\* cited by examiner

*Primary Examiner*—Hal Wachsman
(74) *Attorney, Agent, or Firm*—Cantor Colburn LLP

(57) ABSTRACT

Methods and systems for predicting a cell capacity associated with a cell of an electrochemical cell system are provided. In one exemplary embodiment, the method determines a first predicate cell capacity of the cell of the electrochemical cell system. The method further includes measuring a voltage of the cell to obtain a measured voltage. The method further includes determining a corrected predicted cell capacity of the cell based on the first predicted cell capacity, the measured voltage, and a gain factor.

23 Claims, 2 Drawing Sheets

METHOD AND SYSTEM FOR BATTERY PARAMETER ESTIMATION

BACKGROUND

The present invention relates to methods and apparatus for estimation of battery pack system model parameters using digital filtering techniques. In particular, Kalman filtering and extended Kalman filtering.

In the context of rechargeable battery pack technologies, it is desired in some applications to be able to estimate quantities that are descriptive of the present battery pack condition, but that may not be directly measured. Some of these quantities may change rapidly, such as the pack state-of-charge (SOC), which can traverse its entire range within minutes. Others may change very slowly, such as cell capacity, which might change as little as 20% in a decade or more of regular use. The quantities that tend to change quickly comprise the "state" of the system, and the quantities that tend to change slowly comprise the time varying "parameters" of the system.

In the context of the battery systems, particularly those that need to operate for long periods of time, as aggressively as possible without harming the battery life, for example, in Hybrid Electric Vehicles (HEVs), Battery Electric Vehicles (BEVs), laptop computer batteries, portable tool battery packs, and the like, it is desired that information regarding slowly varying parameters (e.g., total capacity) be available to determine pack health, and to assist in other calculations, including that of state-of-charge (SOC).

There are a number of existing methods for estimating the state-of-health of a cell, which are generally concerned with estimating two quantities: power-fade, and capacity-fade (both slowly time varying). Power fade may be calculated if the present and initial pack electrical resistances are known, and capacity fade may be calculated if present and initial pack total capacities are known, for example, although other methods may also be used. Power- and capacity-fade are often lumped under the description "state-of-health" (SOH). Some other information may be derived using the values of these variables, such as the maximum power available from the pack at any given time. Additional parameters may also be needed for specific applications, and individual algorithms would typically be required to find each one.

The prior art uses the following different approaches to estimate SOH: the discharge test, chemistry-dependent methods, Ohmic tests, and partial discharge. The discharge test completely discharges a fully charged cell in order to determine its total capacity. This test interrupts system function and wastes cell energy. Chemistry-dependent methods include measuring the level of plate corrosion, electrolyte density, and "coup de fouet" for lead-acid batteries. Ohmic tests include resistance, conductance and impedance tests, perhaps combined with fuzzy-logic algorithms and/or neural networks. These methods require invasive measurements. Partial discharge and other methods compare cell-under-test to a good cell or model of a good cell.

There is a need for a method to continuously estimate the parameters of a cell, such as the cell's resistance and capacity. Furthermore, there is a need for tests that do not interrupt system function and do not waste energy, methods that are generally applicable (e.g., to different types of cell electrochemistries and to different applications), methods that do not require invasive measurements, and more rigorous approaches. There is a need for a method that will work with different configurations of parallel and/or series cells in a battery pack.

SUMMARY OF THE INVENTION

Methods and apparatus for estimating the parameters of an electrochemical cell. More particularly, for example, estimating parameter values of a cell.

A first aspect of the invention is a method for estimating present parameters of an electrochemical cell system comprising: making an internal parameter prediction of the cell; making an uncertainty prediction of the internal parameter prediction; correcting the internal parameter prediction and the uncertainty prediction; and applying an algorithm that iterates the internal parameter prediction, and the uncertainty prediction and the correction to yield an ongoing estimation to the parameters and an ongoing uncertainty to the parameters estimation.

Another aspect is an apparatus configured to estimate present parameters of an electrochemical cell comprising: a component configured to make an internal parameter prediction of the cell; a component configured to make an uncertainty prediction of the internal parameter prediction; a component configured to correct the internal parameter prediction and the uncertainty prediction; and a component configured to iterate steps taken by the component configured to make an internal parameter prediction, the component configured to make an uncertainty prediction and the component configured to correct to yield an ongoing estimation to the parameter and an ongoing uncertainty to the parameter estimation.

Also disclosed herein in an exemplary embodiment is a system for estimating present parameters of an electrochemical cell including: a means for making an internal parameter prediction of the electrochemical cell; a means for making an uncertainty prediction of the internal parameter prediction; a means for correcting the internal parameter prediction and the uncertainty prediction; and a means for applying an algorithm that iterates the making an internal parameter prediction, the making an uncertainty prediction and the correcting to yield an ongoing estimation to the parameters and an ongoing uncertainty to the parameters estimation.

Further, disclosed herein in another exemplary embodiment is a storage medium encoded with a machine-readable computer program code including instructions for causing a computer to implement the abovementioned method for estimating present parameters of an electrochemical cell.

Also disclosed herein in yet another exemplary embodiment computer data signal embodied in a computer readable medium. The computer data signal comprises code configured to cause a computer to implement the abovementioned method for estimating present parameters of an electrochemical cell.

BRIEF DESCRIPTION OF THE DRAWINGS

These and other features, aspects and advantages of the present invention will become better understood with regard to the following description, appended claims and accompanying drawing wherein like elements are numbered alike in the several Figures:

DETAILED DESCRIPTION OF THE INVENTION

Figure 1:
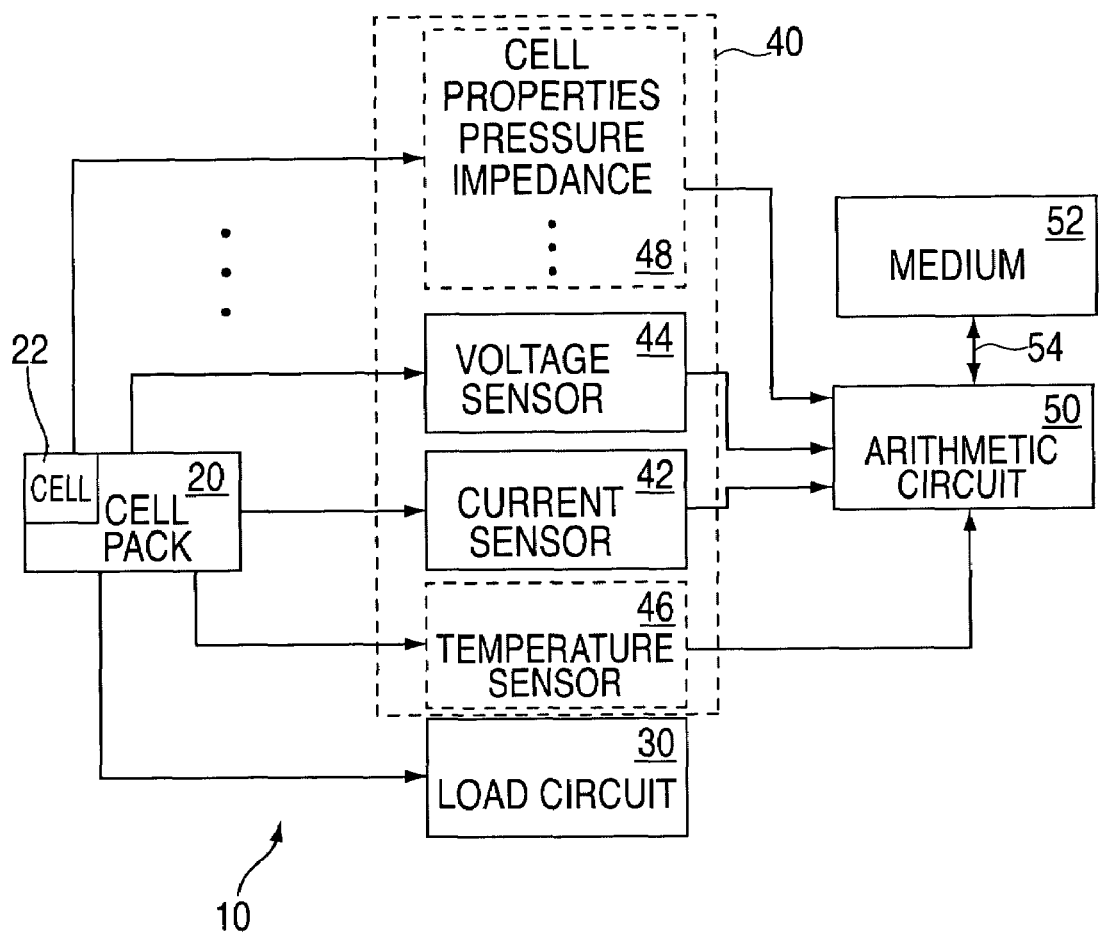
FIG. 1 is a block diagram illustrating an exemplary system for parameter estimation in accordance with an exemplary embodiment of the invention.
Figure 2:
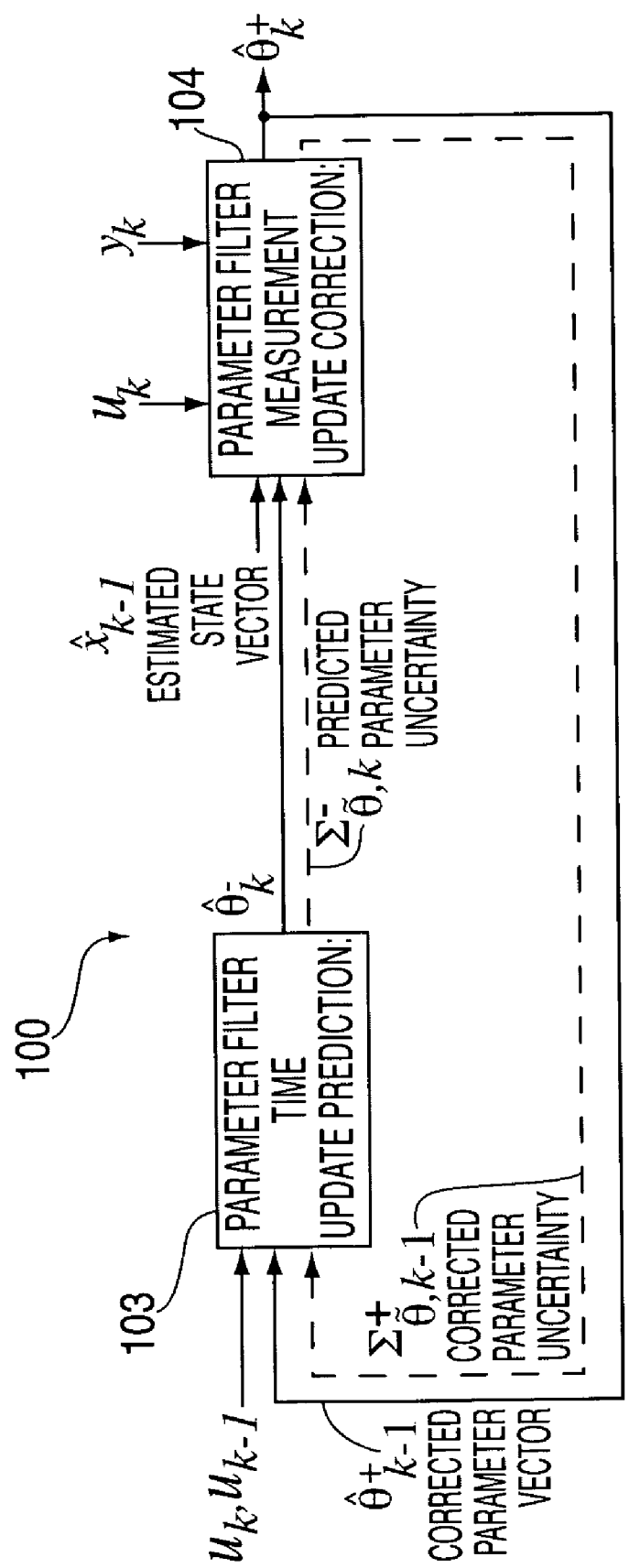
FIG. 2 is a block diagram depicting a method of filtering for parameter estimation, in accordance with an exemplary embodiment of the invention.

Disclosed herein and various embodiments are methods, systems and apparatus for the estimation of parameters of an electrochemical cell using filtering are disclosed. Referring now to FIGS. 1 and 2, in the following description, numerous specific details are set forth in order to provide a more complete understanding of the present invention. It will be appreciated that while the exemplary embodiments are described with reference to a battery cell, numerous electrochemical cells hereinafter referred to as a cell, may be employed, including, but not limited to, batteries, battery packs, ultracapacitors, capacitor banks, fuel cells, electrolysis cells, and the like, as well as combinations including at least one of the foregoing. Furthermore, it will be appreciated that a battery or battery pack may include a plurality of cells, where the exemplary embodiments disclosed herein are applied to one or more cells of the plurality.

One or more exemplary embodiments of the present invention estimate cell parameter values using a filtering method. One or more exemplary embodiments of the present invention estimate cell parameter values using Kalman filtering. Some embodiments of the present invention estimate cell parameter values using extended Kalman filtering. Some embodiments estimate cell resistance. Some embodiments estimate cell total capacity. Some embodiments estimate other time-varying parameter values. It will further be appreciated that while the term filtering is employed for description and illustration of the exemplary embodiments, the terminology is intended to include methodologies of recursive prediction and correction commonly denoted as filtering, including but not limited to Kalman filtering and/or extended Kalman filtering.

FIG. 1 shows the components of the parameter estimator system 10 according an embodiment of the present invention. Electrochemical cell pack 20 comprising a plurality of cells 22, e.g., battery is connected to a load circuit 30. For example, load circuit 30 could be a motor in an Electric Vehicle (EV) or a Hybrid Electric Vehicle (HEV). An apparatus for measuring various cell characteristics and properties is provided as 40. The measurement apparatus 40 may include but not be limited to a device for measurement of cell terminal voltage such as a voltage sensor 42, e.g. a voltmeter and the like, while measurements of cell current are made with a current sensing device 44, e.g., an ammeter and the like. Optionally, measurements of cell temperature are made with a temperature sensor 46, e.g., a thermometer and the like. Additional cell properties, such as internal pressure or impedance, may be measured using (for example) pressure sensors and/or impedance sensors 48 and may be employed for selected types of cells. Various sensors may be employed as needed to evaluate the characteristics and properties of the cell(s). Voltage, current, and optionally temperature and cell-property measurements are processed with an arithmetic circuit 50, e.g., processor or computer, which estimates the parameters of the cell(s). The system may also include a storage medium 52 comprising any computer usable storage medium known to one of ordinary skill in the art. The storage medium is in operable communication with arithmetic circuit 50 employing various means, including, but not limited to a propagated signal 54. It should be appreciated that no instrument is required to take measurements from the internal chemical components of the cell 22 although such instrumentation may be used with this invention. Also note that all measurements may be non-invasive; that is, no signal must be injected into the system that might interfere with the proper operation of load circuit 30.

In order to perform the prescribed functions and desired processing, as well as the computations therefore (e.g., the modeling, estimation of parameters prescribed herein, and the like), arithmetic circuit 50 may include, but not be limited to, a processor(s), gate array(s), custom logic, computer(s), memory, storage, register(s), timing, interrupt(s), communication interfaces, and input/output signal interfaces, as well as combinations comprising at least one of the foregoing. Arithmetic circuit 50 may also include inputs and input signal filtering and the like, to enable accurate sampling and conversion or acquisitions of signals from communications interfaces and inputs. Additional features of arithmetic circuit 50 and certain processes therein are thoroughly discussed at a later point herein.

One or more embodiments of the invention may be implemented as new or updated firmware and software executed in arithmetic circuit 50 and/or other processing controllers. Software functions include, but are not limited to firmware and may be implemented in hardware, software, or a combination thereof. Thus a distinct advantage of the present invention is that it may be implemented for use with existing and/or new processing systems for electrochemical cell charging and control.

In an exemplary embodiment, Arithmetic circuit 50 uses a mathematical model of the cell 22 that includes indicia of a dynamic system state. In one embodiment of the present invention, a discrete-time model is used. An exemplary model for the cell 22 in a (possibly nonlinear) discrete-time state-space form has the form:

$$x_{k+1} = f(x_k, u_k, \theta_k) + w_k$$

$$y_k = g(x_k, u_k, \theta_k) + v_k, \quad (1)$$

where $x_k$ is the system state, $\theta_k$ is the set of time varying model parameters, $u_k$ is the exogenous input, $y_k$ is the system output, and $w_k$ and $v_k$ are "noise" inputs—all quantities may be scalars or vectors. $f(x_k, u_k, \theta_k)$ and $g(x_k, u_k, \theta_k)$ are functions defined by the cell model being used. Non-time-varying numeric values required by the model may be embedded within $f(x_k, u_k, \theta_k)$ and $g(x_k, u_k, \theta_k)$, and are not included in $\theta_k$.

The system state $x_k$ includes, at least, a minimum amount of information, together with the present input and a mathematical model of the cell, needed to predict the present output. For a cell 22, the state might include: SOC, polarization voltage levels with respect to different time constants, and hysteresis levels, for example. The system exogenous input $u_k$ includes at minimum the present cell current $i_k$, and may, optionally, include cell temperature (unless temperature change is itself modeled in the state). The system parameters $\theta_k$ are the values that change only slowly with time, in such a way that they may not be directly determined with knowledge of the system measured input and output. These might include, but not be limited to: cell capacity, resistance, polarization voltage time constant(s), polarization voltage blending factor(s), hysteresis blending factor(s), hysteresis rate constant(s), efficiency factor(s), and so forth. The model output $y_k$ corresponds to physically measurable cell quantities or those directly computable from measured quantities at minimum for example, the cell voltage under load.

There are a number of existing methods for estimating the state of a cell including, but not limited to the state charge of a cell 22. SOC is a value, typically reported in percent, which indicates the fraction of the cell capacity presently available to do work. A number of different approaches to estimating SOC have been employed: a discharge test, ampere-hour counting (Coulomb counting), measuring the electrolyte, open-circuit voltage measurement, linear and nonlinear circuit modeling, impedance spectroscopy, measurement of internal resistance, coup de fouet, and some forms of Kalman filtering. Each of these methodologies exhibits advantages as well as limitations.

Another method for determination of SOC is disclosed in commonly assigned U.S. Pat. No. 6,534,954 to Plett, the contents of which are incorporated by reference herein in their entirety. In this example, a filter, preferably a Kalman filter is used to estimate SOC by employing a known mathematical model of cell dynamics and measurements of cell voltage, current, and temperature. Advantageously, this method directly estimates state values for the cell where SOC is at least one of the states. However, it should be appreciated that there are numerous well-known methodologies for computing SOC.

Continuing with FIG. 2, a mathematical model of parameter dynamics is also utilized. An exemplary model has the form:

$$\theta_{k+1} = \theta_k + r_k$$

$$d_k = g(x_k, u_k, \theta_k) + e_k. \quad (2)$$

The first equation states that the parameters $\theta_k$ are primarily constant, but that they may change slowly over time, in this instance, modeled by a "noise" process denoted, $r_k$. The "output" $d_k$ is a function of the optimum parameter dynamics modeled by $g(\bullet,\bullet,\bullet)$ plus some estimation error $e_k$. The optimum parameter dynamics $g(\bullet,\bullet,\bullet)$ being a function of the system state $x_k$, an exogenous input $u_k$, and the set of time varying parameters $\theta_k$.

With a model of the cell system, requirements for state dynamics, and model of the parameter dynamics defined, in an exemplary embodiment, a procedure of filtering is applied. Once again, alternatively, a Kalman filter may be employed, or an extended Kalman filter. Table 1 identifies an exemplary implementation of the methodology and system utilizing an extended Kalman filter 100. Once again, it should be appreciated that while the cell model and parameter estimation models employ the state $x_k$ of the cell 22, the state is not necessarily predicted as part of the parameter estimation process. For example, in one exemplary embodiment, the state $x_k$ of the cell 22, is computed by another process with the resulting state information supplied to the parameters model. Continuing with an exemplary implementation of Table 1, the procedure is initialized by setting a parameter estimate, denoted $\hat{\theta}$ to the best guess of the true parameters, e.g., $\hat{\theta} = E[\theta_0]$. While not required or defined for the state estimate, the state estimate denoted $\hat{x}$ may be set to the best estimate of the cell state, e.g., $\hat{x} = E[x_0]$. An estimation-error covariance matrix $\Sigma_{\tilde{\theta}}^+$ is also initialized. For example, an initialization of state, and particularly, SOC might be estimated/based on a cell voltage in a look-up table, or information that was previously stored when a battery pack/cell was last powered down. Other examples might incorporate the length of time that the battery system had rested since power-down and the like.

TABLE 1

Extended Kalman filter for parameter update.

State-space models:

$$x_{k+1} = f(x_k, u_k, \theta_k) + w_k \quad \theta_{k+1} = \theta_k + r_k$$
$$y_k = g(x_k, u_k, \theta_k) + v_k \quad \text{and} \quad d_k = g(x_k, u_k, \theta_k) + e_k,$$

where $w_k$, $v_k$, $r_k$ and $e_k$ are independent, zero-mean, Gaussian noise processes of covariance matrces. $\Sigma_w$, $\Sigma_v$, $\Sigma_r$ and $\Sigma_e$, respectively.
Definition:

$$C_k^\theta = \left. \frac{dg(\hat{x}_k^-, u_k, \theta)}{d\theta} \right|_{\theta = \hat{\theta}_k^-}$$

Initialization. For k = 0, set $$\hat{\theta}_0^+ = E[\theta_0], \quad \sum_{\tilde{\theta},0}^+ = E\left[(\theta_0 - \hat{\theta}_0^+)(\theta_0 - \hat{\theta}_0^+)^T\right]$$

Computation. For k = 1,2, ..., compute:
Time update $$\hat{\theta}_k^- = \hat{\theta}_{k-1}^+$$

$$\sum_{\tilde{\theta},0}^- = \sum_{\tilde{\theta},0}^+ + \sum_r$$

Measurement update $$L_k^\theta = \sum_{\tilde{\theta},k}^- (C_k^\theta)^T \left[ C_k^\theta \sum_{\tilde{\theta},0}^- (C_k^\theta)^T + \sum_e \right]^{-1}$$

$$\hat{\theta}_k^+ = \hat{\theta}_k^- + L_k^\theta [y_k - g(f(\hat{x}_{k-1}, u_{k-1}; \hat{\theta}_k^-), u_k, \hat{\theta}_k^-)]$$

$$\sum_{\tilde{\theta},k}^+ = (I - L_k^\theta C_k^\theta) \sum_{\tilde{\theta},k}^-.$$

In this example, several steps are performed in each measurement interval. First, the previous parameter estimate is propagated forward in time. The new parameter estimate is equal to the old parameter estimate $\hat{\theta}_k^- = \hat{\theta}_{k-1}^+$, and the parameter error uncertainty is larger due to the passage of time (accommodated for in the model by the driving noise $r_k$). It should be readily appreciated that various possibilities exist for updating the parameter uncertainty estimate, the table provides an illustrative example. A measurement of the cell output is made, and compared to the predicted output based on the state estimate, $\hat{x}$ (however estimated or provided) and parameter estimate, $\hat{\theta}$; the difference is used to update the values of $\hat{\theta}$. Note also, the state estimate $\hat{x}$ may be propagated forward by the parameter estimate or may be supplied via an external means as identified above. $C_k^\theta$ may be computed using the following recurrence relationship:

$$\frac{dg(x_k, u_k, \theta)}{d\theta} = \frac{\partial g(x_k, u_k, \theta)}{\partial \theta} + \frac{\partial g(x_k, u_k, \theta)}{\partial x_k} \frac{dx_k}{d\theta}, \quad (3)$$

$$\frac{dx_k}{d\theta} = \frac{\partial f(x_{k-1}, u_{k-1}, \theta)}{d\theta} + \frac{\partial f(x_{k-1}, u_{k-1}, \theta)}{\partial x_{k-1}} \frac{dx_{k-1}}{d\theta}.$$

The derivative calculations are recursive in nature, and evolve over time as the state $x_k$ evolves. The term $dx_0/d\theta$ is initialized to zero unless side information yields a better estimate of its value. It may readily be appreciated that the steps outlined in the table may be performed in a variety of orders. While the table lists an exemplary ordering for the purposes of illustration, those skilled in the art will be able to identify many equivalent ordered sets of equations.

Turning now to FIG. 2 as well, an exemplary implementation of an exemplary embodiment of the invention is depicted. A recursive filter 100 adapts the parameter estimate, $\hat{\theta}$. The filter has a time update or prediction 103 aspect and a measurement update or correction 104 aspect. Parameter time update/prediction block 103 receives as input the previous exogenous input $u_{k-1}$, the previous time varying parameters estimate $\hat{\theta}_{k-1}^{+}$ and a corrected parameter uncertainty estimate $$\sum_{\tilde{\theta},k-1}^{+}$$

Parameter time update/prediction block 103 outputs predicted parameters $\hat{\theta}_k^{-}$ and predicted parameter uncertainty $$\sum_{\tilde{\theta},k}^{-}$$

to the parameter measurement update/correction block 104. Parameter measurement update block 104, which provides current parameter estimate $\hat{\theta}_k^{+}$ and parameter uncertainty estimate, $$\sum_{\tilde{\theta},k}^{+}$$

receives the predicted parameters $\hat{\theta}_k^{-}$ and predicted parameter uncertainty $$\sum_{\tilde{\theta},k}^{-}$$

as well as the exogenous input $u_k$ and the modeled system output $y_k$. It will also be appreciated that a minus notation denotes that the vector is the result of the prediction component 103 of the filter 100, while the plus notation denotes that the vector is the result of the correction component 104 of the filter 100.

Embodiments of this invention require a mathematical model of cell state and output dynamics for the particular application. In the exemplary embodiments, this is accomplished by defining specific functions for $f(x_k,u_k,\theta_k)$ and $g(x_k,u_k,\theta_k)$ to facilitate estimation or receipt of the various states and estimation of the various parameters of interest. An exemplary embodiment uses a cell model that includes effects due to one or more of the open-circuit-voltage (OCV) for the cell 22, internal resistance, voltage polarization time constants, and a hysteresis level. For the purpose of example, parameter values are fitted to this model structure to model the dynamics of high-power Lithium-Ion Polymer Battery (LiPB) cells, although the structure and methods presented here are general and apply to other electrochemistries. For example, in an exemplary embodiment, the states and parameters of interest are embedded in $f(x_k,u_k,\theta_k)$ and $g(x_k,u_k,\theta_k)$, and examples follow:

$$\theta_k = [\eta_{i,k}, C_k, a_{1,k} \ldots a_{n_f,k}, g_{1,k} \ldots g_{n_f-1,k}, \gamma_k, R_k, M_k]^T \quad (4)$$

where $\eta_{i,k}$ is an efficiency factor(s) such as Coulombic efficiency,
$C_k$ is the cell capacity/capacities,
$a_{1,k}, \ldots a_{n_f,k}$ are polarization voltage time constant(s),
$g_{1,k}, \ldots g_{n_f-1,k}$ are the polarization voltage blending factor(s),
$R_k$ is the cell resistance(s),
$M_k$ is the hysteresis blending factor(s), and
$\gamma_k$ is the hysteresis rate constant(s).

In this example, SOC is captured by one state of the model as part of function $f(\bullet,\bullet,\bullet)$. This equation is:

$$z_{k+1} = z_k - (\eta_{i,k}\Delta t/C_k)i_k \quad (5)$$

where $\Delta t$ represents the inter-sample period (in seconds), $C_k$ represents the cell capacity (in ampere-seconds), $z_k$ is the cell SOC at time index k, $i_k$ is the cell current, and $\eta_{i,k}$ is the Coulombic efficiency of a cell at current level $i_k$.

In this example, the polarization voltage levels are captured by several filter states. If we let there be $n_f$ polarization voltage time constants, then $$f_{k+1} = A_f f_k + B_f i_k. \quad (6)$$

The matrix $A_f \in \mathfrak{R}^{n_f \times n_f}$ may be a diagonal matrix with real-valued polarization voltage time constants $a_{1,k} \ldots a_{n_f,k}$. If so, the system is stable if all entries have magnitude less than one. The vector $B_f \in \mathfrak{R}^{n_f \times 1}$ may simply be set to $n_f$ "1"s. The entries of $B_f$ are not critical as long as they are non-zero. The value of $n_f$ entries in the $A_f$ matrix are chosen as part of the system identification procedure to best fit the model parameters to measured cell data. The $A_f$ and $B_f$ matrices may vary with time and other factors pertinent to the present battery pack operating condition.

In this example, the hysteresis level is captured by a single state $$h_{k+1} = \exp\left(-\left|\frac{\eta_{i,k}i_k\gamma_k\Delta t}{C_k}\right|\right)h_k + \left(1 - \exp\left(-\left|\frac{\eta_{i,k}i_k\gamma_k\Delta t}{C_k}\right|\right)\right)\text{sgn}(i_k), \quad (7)$$

where $\gamma_k$ is the hysteresis rate constant, again found by system identification.

In yet another exemplary embodiment, the overall model state is a combination of the above examples as follows:

$$x_k = [f_k^T \; h_k \; z_k]^T, \quad (8)$$

where other orderings of states are possible.

In this example, the output equation that combines the state values to predict cell voltage is $$v_k = \text{OCV}(z_k) + G_k f_k - R_k i_k + M_k h_k, \quad (9)$$

where $G_k \in \mathfrak{R}^{1 \times n_f}$ is a vector of polarization voltage blending factors $g_{1,k} \ldots g_{n_f,k}$ that blend the polarization voltage states together in the output, $R_k$ is the cell resistance (different values may be used for discharge/charge), and $M_k$ is the hysteresis blending factor. Note, $G_k$ may be constrained such that the dc-gain from $i_k$ to $G_k f_k$ is zero, which results in the estimates of $R_k$ being accurate.

Some embodiments of the present invention may include methods to constrain the parameters of the model to result in a stable system. In an exemplary embodiment, the state equation may include terms for polarization voltage time constants in the form $f_{k+1}=A_f f_k + B_f i_k$, where the matrix $A_f \in \Re^{n_f \times n_f}$ is diagonal matrix with real-valued polarization voltage time constants $a_{1,k} \ldots a_{n_f,k}$. These time constants may be computed as $a_{i,k}=\tan h(\alpha_{i,k})$, where the parameter vector of the model contains the $\alpha_{i,k}$ values and not directly the $a_{i,k}$ values. The tan h( ) function ensures that the $a_{i,k}$ are always within ±1 (i.e., stable) regardless of the value of $\alpha_{i,k}$.

Some embodiments of the present invention include constraints to the model to ensure convergence of a parameter to its correct value. An exemplary embodiment using the model herein described constrains $G_k$ so that the dc-gain from $i_k$ to $G_k f_k$ is zero, which results in the estimates of $R_k$ being accurate. This is done by enforcing that the last element of $G_k$ be computed using other elements of $G_k$ and the polarization voltage time constants $$g_{n_f,k} = -\sum_{i=1}^{n_f-1} g_{i,k}(1-a_{n_f,k})/(1-a_{i,k}).$$

This also requires more care when computing elements of $C_k^e$ relating to $$G_k: \frac{\partial g(x_k, u_k, \theta)}{\partial g_{i,k}} = f_{k,i} - \frac{1-a_{n_f,k}}{1-a_{i,k}} f_{k,n_f}, \quad 1 \le i < n_f.$$

If the $a_{i,k}$ values are always within ±1 (for example, by using the method described in the previous paragraph), then there will never be a divide-by-zero problem with the derivative computation.

Another exemplary embodiment includes methods for estimating important aspects of SOH without employing a full filter 100. The full filter 100 method may be computationally intensive. If precise values for the full set of cell model parameters are not necessary, then other methods potentially less complex or computationally intensive might be used. The exemplary methodologies determine cell capacity and resistance using filtering methods. The change in capacity and resistance from the nominal "new-cell" values give capacity fade and power fade, which are the most commonly employed indicators of cell SOH.

In this example, to estimate cell resistance using a filtering mechanism, we formulate a model:

$$R_{k+1}=R_k+r_k$$

$$y_k=\text{OCV}(z_k)-i_k R_k+e_k \quad (10)$$

where $R_k$ is the cell resistance and is modeled as a constant value with a fictitious noise process $r_k$ allowing adaptation. $y_k$ is an estimate of the cell's voltage, $i_k$ is the cell current, and $e_k$ models estimation error. If an estimate of $z_k$ that may be externally generated and supplied is employed, then a filter 100 may be applied to this model to estimate cell resistance. In the standard filter 100, the model's prediction of $y_k$ is compared with the true measured cell voltage. Any difference resultant from the comparison is used to adapt $R_k$.

Note that the above model may be extended to handle different values of resistance for a variety of conditions of the cell 22. For example, differences based on charge and discharge, different SOCs, and different temperatures. The scalar $R_k$ may then be established as a vector comprising all of the resistance values being modified, and the appropriate element from the vector would be used each time step of the filter during the calculations.

In this example, to estimate cell capacity using a filter 100, we again formulate a cell model:

$$C_{k+1}=C_k+r_k$$

$$0=z_k-z_{k-1}+\eta_{i,k}i_{k-1}\Delta t/C_{k-1}+e_k. \quad (11)$$

Again, a filter is formulated using this model to produce a capacity estimate. As the filter 100 runs, the computation in the second equation (right-hand-side) is compared to zero, and the difference is used to update the capacity estimate. Note that good estimates of the present and previous states-of-charge are desired, possibly from a filter estimating SOC. Estimated capacity may again be a function of temperature (and so forth), if desired, by employing a capacity vector, from which the appropriate element is used in each time step during calculations.

Thus, a method for estimation of cell parameters has been described in conjunction with a number of specific embodiments. One or more embodiments use a Kalman filter 100. Some embodiments use an extended Kalman filter 100. Further, some embodiments include a mechanism to force convergence of one or more parameters. One or more embodiments include a simplified parameter filter 100 to estimate resistance, while some embodiments include a simplified parameter filter 100 to estimate total capacity. The present invention is applicable to a broad range of applications, and cell electrochemistries.

The disclosed method may be embodied in the form of computer-implemented processes and apparatuses for practicing those processes. The method can also be embodied in the form of computer program code containing instructions embodied in tangible media 52, such as floppy diskettes, CD-ROMs, hard drives, or any other computer-readable storage medium, wherein, when the computer program code is loaded into and executed by a computer, the computer becomes an apparatus capable of executing the method. The present method can also be embodied in the form of computer program code, for example, whether stored in a storage medium, loaded into and/or executed by a computer, or as data signal 54 transmitted whether a modulated carrier wave or not, over some transmission medium, such as over electrical wiring or cabling, through fiber optics, or via electromagnetic radiation, wherein, when the computer program code is loaded into and executed by a computer, the computer becomes an apparatus capable of executing the method. When implemented on a general-purpose microprocessor, the computer program code segments configure the microprocessor to create specific logic circuits.

It will be appreciated that the use of first and second or other similar nomenclature for denoting similar items is not intended to specify or imply any particular order unless otherwise stated. Furthermore, the use of the terminology "a" and "at least one" of shall each be associated with the meaning "one or more" unless specifically stated otherwise.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for predicting a cell capacity associated with a cell of an electrochemical cell system, comprising:
determining a first predicted cell capacity of the cell of the electrochemical cell system;
measuring a voltage of the cell to obtain a measured voltage;
determining a difference between the measured voltage and an estimated voltage to obtain a difference value;
multiplying the difference value by a first gain factor to obtain a first correction value;
summing the correction value by the first predicted cell capacity to obtain a corrected predicted cell capacity of the cell; and
storing the corrected predicted cell capacity of the cell in a storage medium.

2. The method of claim 1, further comprising:
measuring a temperature of the cell to obtain a measured temperature, wherein the corrected predicted cell capacity is also based on the measured temperature.

3. The method of claim 1, further comprising:
measuring a current of the cell to obtain a measured current, wherein the corrected predicted cell capacity is also based on the measured current.

4. The method of claim 1, further comprises:
determining a first predicted resistance of the cell;
multiplying the difference value by a second gain factor to obtain a second correction value;
summing the second correction value by the first predicted resistance of the cell to obtain a corrected predicted resistance of the cell; and
storing the corrected predicted resistance of the cell in the storage medium.

5. The method of claim 1, further comprising:
determining a first predicted polarization voltage time constant of the cell;
multiplying the difference value by a second gain factor to obtain a second correction value;
summing the second correction value by the first predicted polarization voltage time constant of the cell to obtain a corrected predicted polarization voltage time constant of the cell; and
storing the corrected predicted polarization voltage time constant of the cell in the storage medium.

6. The method of claim 1, further comprises:
determining a first predicted polarization voltage blending factor of the cell;
multiplying the difference value by a second gain factor to obtain a second correction value;
summing the second correction value by the first predicted polarization voltage blending factor of the cell to obtain a corrected predicted polarization voltage blending factor of the cell; and
storing the corrected predicted polarization voltage blending factor of the cell in the storage medium.

7. The method of claim 1, further comprising:
determining a first predicted hysteresis blending factor of the cell;
multiplying the difference value by a second gain factor to obtain a second corrected value;
summing the second correction value by the first predicted hysteresis blending factor of the cell to obtain a corrected predicted hysteresis blending factor of the cell; and
storing the corrected predicted hysteresis blending factor of the cell in the storage medium.

8. The method of claim 1, further comprising:
determining a first predicted hysteresis rate of the cell;
multiplying the difference value by a second gain factor to obtain a second correction value;
summing the second correction value by the first predicted hysteresis rate of the cell to obtain a corrected predicted hysteresis rate of the cell; and
storing the corrected predicted hysteresis rate of the cell in the storage medium.

9. The method of claim 1, further comprising:
determining a first predicted efficiency factor of the cell;
multiplying the difference value by a second gain factor to obtain a second correction value;
summing the second correction value by the first predicted efficiency factor of the cell to obtain a corrected predicted efficiency factor of the cell; and
storing the corrected predicted efficiency factor of the cell in the storage medium.

10. The method of claim 1, further comprising:
determining a first predicted uncertainty associated with the first predicted cell capacity;
determining the first gain factor based on the predicted uncertainty; and
determining a corrected predicted uncertainty associated with the corrected predicted cell capacity based on the first predicted uncertainty and a second gain factor.

11. The method of claim 1 wherein the corrected predicted cell capacity is also determined utilizing at least one of a Kalman Filter and an extended Kalman Filter.

12. The method of claim 1, further comprising ensuring convergence of the corrected predicted cell capacity to a respective physical cell capacity.

13. The method of claim 12 wherein said ensuring includes forcing a dc gain of a voltage polarization filter to be zero.

14. The method of claim 1 further comprising ensuring stability of a model dynamics of the electrochemical cell system by forcing filter poles to have a magnitude less than 1.

15. A system for predicting a cell capacity associated with a cell of an electrochemical cell system, comprising:
a voltage sensor configured to measure a voltage of the cell of the electrochemical cell system to obtain a measured voltage; and
an arithmetic circuit operably coupled to the voltage sensor, the arithmetic circuit configured to determine a first predicted cell capacity of the cell, the arithmetic circuit further configured to determine a difference between the measured voltage and an estimated voltage to obtain a difference value, the arithmetic circuit further configured to multiply the difference value by a first gain factor to obtain a first correction value, the arithmetic circuit further configured to sum the first correction value by the first predicted cell capacity to obtain a corrected predicted cell capacity of the cell, the arithmetic circuit further configured to store the corrected predicted cell capacity of the cell in a storage medium.

16. The system of claim 15, further comprising
a temperature sensor configured to measure a temperature of the cell to obtain a measured temperature, the temperature sensor operably coupled to the arithmetic circuit, wherein the corrected predicted cell capacity is also based on the measured temperature.

17. The system of claim 15, further comprising:
a current sensor configured to measure a current of the cell to obtain a measured current, the current sensor operably coupled to the arithmetic circuit, wherein the corrected predicted cell capacity is also based on the measured current.

18. The system of claim 15, wherein the arithmetic circuit is further configured to determine a first predicted resistance of the cell, the arithmetic circuit further configured to multiply the difference value by a second gain factor to obtain a second correction value, the arithmetic circuit further configured to sum the second correction value by the first predicted resistance of the cell to obtain a corrected predicted resistance of the cell, the arithmetic circuit further configured to store the corrected predicted resistance of the cell in the storage medium.

19. The system of claim 15, wherein the arithmetic circuit is further configured to determine a first predicted uncertainty associated with the first predicted cell capacity, the arithmetic circuit further configured to determine the first gain factor based on the first predicted uncertainty, the arithmetic circuit further configured to determine a corrected predicted uncertainty associated with the corrected predicted cell capacity based on the first predicted uncertainty and a second gain factor, the arithmetic circuit further configured to store the corrected predicted cell capacity in the storage medium.

20. A method for predicting a resistance associated with a cell of an electrochemical cell system, comprising:
determining a first predicted resistance of the cell of the electrochemical cell system;
measuring a voltage of the cell to obtain a measured voltage;
determining a difference between the measured voltage and an estimated voltage to obtain a difference value;
multiplying the difference value by a gain factor to obtain a correction value;
summing the correction value by the first predicted resistance of the cell to obtain a corrected predicted resistance of the cell; and
storing the corrected predicted resistance of the cell in the storage medium.

21. A system for predicting a resistance associated with a cell of an electrochemical cell system, comprising:
a voltage sensor configured to measure a voltage of the cell of the electrochemical cell system to obtain a measured voltage; and
an arithmetic circuit operably coupled to the voltage sensor, the arithmetic circuit configured to determine a first predicted resistance of the cell, the arithmetic circuit further configured to determine a difference between the measured voltage and an estimated voltage to obtain a difference value, the arithmetic circuit further configured to multiply the difference value by a gain factor to obtain a correction value, the arithmetic circuit further configured to sum the correction value by the first predicted resistance of the cell to obtain a corrected predicted resistance of the cell, the arithmetic circuit further configured to store the corrected predicted resistance of the cell in the storage medium.

22. A computer program product for predicting a cell capacity associated with a cell of an electrochemical cell system, the computer program product comprising:
a storage medium readable by a processing circuit and storing instructions for execution by the processing circuit for facilitating a method comprising:
determining a first predicted cell capacity of the cell of the electrochemical cell system;
measuring a voltage of the cell to obtain a measured voltage;
determining a difference between the measured voltage and an estimated voltage to obtain a difference value;
multiplying the difference value by a gain factor to obtain a correction value;
summing the correction value by the first predicted cell capacity to obtain a corrected predicted cell capacity of the cell; and
storing the corrected predicted cell capacity of the cell in the storage medium.

23. A computer program product for predicting a resistance associated with a cell of an electrochemical cell system, the computer program product comprising:
a storage medium readable by a processing circuit and storing instructions for execution by the processing circuit for facilitating a method comprising:
determining a first predicted resistance of the cell of the electrochemical cell system;
measuring a voltage of the cell to obtain a measured voltage;
determining a difference between the measured voltage and an estimated voltage to obtain a difference value;
multiplying the difference value by a gain factor to obtain a correction value;
summing the correction value by the first predicted resistance of the cell to obtain a corrected predicted resistance of the cell; and
storing the corrected predicted resistance of the cell in the storage medium.

* * * * *